United States Patent
Xiao et al.

(10) Patent No.: US 9,991,905 B2
(45) Date of Patent: Jun. 5, 2018

(54) ENCODING METHOD, DECODING METHOD, ENCODER AND DECODER

(75) Inventors: Wei Xiao, Shenzhen (CN); Qing Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1570 days.

(21) Appl. No.: 13/572,980

(22) Filed: Aug. 13, 2012

(65) Prior Publication Data

US 2012/0307909 A1 Dec. 6, 2012

Related U.S. Application Data

(63) Continuation of application No. PCT/CN2011/070009, filed on Jan. 4, 2011.

(30) Foreign Application Priority Data

Feb. 11, 2010 (CN) .......................... 2010 1 0117704

(51) Int. Cl.
*H04N 7/12* (2006.01)
*H03M 7/30* (2006.01)

(52) U.S. Cl.
CPC ................................ *H03M 7/3082* (2013.01)

(58) Field of Classification Search
CPC ................................................... H03M 7/3082
See application file for complete search history.

(56) References Cited

U.S. PATENT DOCUMENTS

| | | | |
|---|---|---|---|
| 6,658,382 B1 * | 12/2003 | Iwakami et al. | 704/224 |
| 2005/0285764 A1 | 12/2005 | Bessette et al. | |
| 2007/0168197 A1 * | 7/2007 | Vasilache | 704/503 |
| 2008/0097749 A1 * | 4/2008 | Xie et al. | 704/200.1 |
| 2008/0097755 A1 | 4/2008 | Xie | |
| 2011/0093275 A1 | 4/2011 | Li | |

FOREIGN PATENT DOCUMENTS

| | | |
|---|---|---|
| CN | 101110214 A | 1/2008 |
| CN | 101266796 A | 9/2008 |
| CN | 101430881 A | 5/2009 |

OTHER PUBLICATIONS

NPL IEEE Transactions on Information Theory, vol. 44. No. I, Jan. 1998.*
Andras Mehes, et al., "Binary Lattice Vector Quantization with Linear Block Codes and Affine Index Assignments", IEEE Transactions on Information Theory, vol. 44, No. 1, Jan. 1998, p. 79-94.

(Continued)

*Primary Examiner* — Md Haque

(57) ABSTRACT

An encoding method, decoding method, encoder, and decoder are provided in embodiments of this invention. The encoding method comprises: selecting at least one dimension vector from at least two dimension vectors to partition the coefficients to be encoded into vectors, according to the number of the coefficients to be encoded contained in a current subband; quantizing the vectors partitioned from the coefficients to be encoded into lattice vectors according to the selected dimension, and then mapping the lattice vectors to lattice index vectors; performing lossless encoding on the lattice index vectors.

22 Claims, 7 Drawing Sheets

(56) References Cited

OTHER PUBLICATIONS

Gan Tao, et al., "Lattice Vector Quantization of Wavelet Image Using Quadtree Structure", Journal of UEST of China, vol. 34, No. 4, Aug. 2005, p. 460-463.
International Search Report dated Apr. 7, 2011 in connection with International Patent Application No. PCT/CN2011/070009.
Written Opinion of the International Searching Authority dated Apr. 7, 2011 in connection with International Patent Application No. PCT/CN2011/070009.

* cited by examiner

US 9,991,905 B2

ENCODING METHOD, DECODING METHOD, ENCODER AND DECODER

CROSS-REFERENCE TO RELATED APPLICATIONS

This application is a continuation of International Application No. PCT/CN2011/070009, filed on Jan. 4, 2011, which claims the priority of the Chinese patent application No. 201010117704.9 filed on Feb. 11, 2010, the entire content of which is incorporated herein by reference.

TECHNICAL FIELD

The embodiments of the present invention relate to the field of video techniques, and more specifically, to an encoding method, decoding method, encoder and decoder.

DESCRIPTION OF THE RELATED ART

Transform domain encoding is one of the most common encoding/decoding techniques in present audio standards, for example, Moving Picture Experts Group Audio Layer III (MP3 for short hereinafter), Advanced Audio Coding (AAC for short hereinafter) and its subsequent versions. In an audio encoding system based on transform domain encoding techniques, its quantizer is one of the core modules of the whole audio encoding system, the role of which is to map input transform coefficients to a limited number of data (in general, integers).

Vector quantizers have widely applications in present audio standards, by which several sequential data is combined and quantized in a consolidated manner. Among vector quantizers, lattice vector quantizers have been adopted prevalently due to their advantage in terms of the amount of storage, etc.

Multi-rate vector quantization encoding methods are applied to frequency spectrum data, and, according to the principle of proximity, quantize a group of 8 data to a point on a $RE_8$ set. After that a distinct codebooks are selected, and values of a corresponding base codebook, a base codebook index, and an extended codebook are outputted.

However, existing mutil-rate vector quantization encoding methods are fixed to 8 dimensions in their lattice selection. However, in some widely adopted standards, for example, AAC, coefficients of a frame may be divided into several subbands, and the number of the coefficients of each of those subbands is an integral multiple of 4, instead of 8. Therefore, for some subbands, e.g., substands each containing 28 coefficients, the existing mutil-rate vector quantization encoding methods may cause an issue of mismatching of dimension.

Furthermore, the efficiency of encoding of the existing mutil-rate vector quantization encoding methods highly depends on statistic-based base codebooks. The efficiency of encoding is higher when an object to be quantized is within a base codebook; on the contrary, when an object to be quantized is not within the base codebook, the amount of bit consumption is huge. In practical applications, taking the encoding of music signals as an example, it is difficult to find a space-limited base codebook to represent statistical distribution character of coefficients of music signals. Thus, in many cases, quite a number of quantization objects do not fall into a pre-trained base codebook, at that point, the existing mutil-rate vector quantization encoding methods have poor encoding efficiency, unwarranted quantization accuracy, and as a result, lower encoding quality.

SUMMARY OF THE INVENTION

An encoding method, decoding method, encoder decoder are provided in embodiments of this invention for the improvement of quantization quality and encoding/decoding efficiency.

An encoding method is provided in one embodiment of this invention, comprising:

according to a number of the coefficients to be encoded contained in a current subband, selecting at least one dimension vector from at least two dimension vectors to partition the coefficients to be encoded of the current subband into vectors;

according to the selected dimension, quantizing the vectors partioned from the coefficients to be encoded into lattice vectors, and then mapping the lattice vectors to lattice index vectors;

performing lossless encoding on the lattice index vectors.

A decoding method is further provided in one embodiment of this invention, comprising:

according to a number of the coefficients to be decoded contained in a current subband, selecting at least one dimension vector from at least two dimension vectors to partition the coefficients to be decoded of the current subband into vectors;

performing lossless decoding on the vectors partitioned from the coefficients to be decoded according to the selected dimension to obtain lattice index vectors;

mapping the lattice index vectors to lattice vectors.

An encoder is further provided in one embodiment of this invention, comprising:

a first vector partition module for, according to a number of the coefficients to be encoded contained in a current subband, selecting at least one dimension vector from at least two dimension vectors to partition the coefficients to be encoded of the current subband into vectors;

a quantization module for, according to the selected dimension, quantizing the vectors partitioned by the first vector partition module into lattice vectors, and then mapping the lattice vectors to lattice index vectors;

an encoding module for performing lossless encoding on the lattice index vectors.

A decoder is further provided in one embodiment of this invention, comprising:

a second vector partition module for, according to a number of the coefficients to be decoded contained in a current subband, selecting at least one dimension vector from at least two dimension vectors to partition the coefficients to be decoded of the current subband into vectors;

a decoding module for performing lossless decoding on the vectors partitioned by the second vector partition module according to the selected dimension to obtain lattice index vectors;

a reverse quantization module for mapping the lattice index vectors to lattice vectors.

With the embodiments of this invention, the encoding side, according to the number of the coefficients to be encoded contained in a current subband, selects at least one dimension vector from at least two dimension vectors to partition the coefficients to be encoded of the current subband into vectors, quantizes the vectors partitioned from the coefficients to be encoded into lattice vectors according to the selected dimension, and then maps the lattice vectors to lattice index vectors, at last, performs lossless encoding on the lattice index vectors, so that the number of bits used in encoding is generally reduced; the decoding side partitions vectors in the same manner as the encoding side, performs decoding through a reverse process of that of the encoding side, so that quantization quality, and thus, encoding/decoding efficiency and encoding/decoding quality can be improved, and a quantization method of high quality is provided suitable for signal types including music signals.

BRIEF DESCRIPTION OF THE DRAWINGS

For a more explicit description of technical solutions of embodiments of this invention or the prior art, a brief introduction of accompanying drawings to be used in the description of these embodiments and the prior art will be given below. Obviously, accompanying drawings described below are merely some embodiments of this invention, for those skilled in the art, other accompanying drawings can be derived from these ones without any creative efforts.

DETAILED DESCRIPTION OF THE PREFERRED EMBODIMENT

For a better clarity of objects, technical solutions, and advantages of the embodiments of this invention, a clear and complete description of technical solutions of embodiments of this invention will be given in connection with accompanying drawings of those embodiments. Obviously, embodiments described herein are merely some embodiments of this invention, but not all of them. Based on those embodiments of this invention, other embodiments can occur to those skilled in the art without any creative efforts, all of which fall within the scope of this invention.

Figure 1:
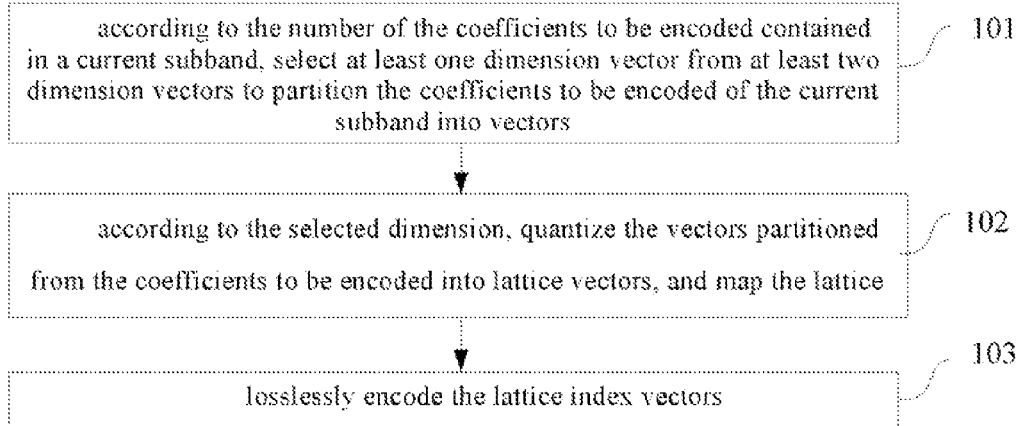
FIG. 1 is a flow chart of an encoding method according to one embodiment of this invention.

FIG. 1 is a flow chart of an encoding method according to one embodiment of this invention. As shown in FIG. 1, the encoding method may comprise the following steps.

At step 101, according to the number of the coefficients to be encoded contained in a current subband, at least one dimension vector is selected from at least two dimension vectors to partition the coefficients to be encoded of the current subband into vectors.

Wherein, the at least two dimension vectors described above may comprise 4-dimensional vector, 6-dimensional vector, 8-dimensional vector, and outer vectors; the at least one dimension vector selected from the at least two dimension vectors described above may be 4-dimensional vector, 6-dimensional vector, 8-dimensional vector, etc. The embodiments of this invention are not limited thereto; however, a selected 4-dimensional vector and/or 8-dimensional vector will be described as an example in this embodiment of the present invention, because, for mainstream audio encoders, the number of the coefficients to be encoded contained in a subband is generally a multiple of 4 or 8.

In one implementation of this embodiment, before partitioning coefficients to be encoded of a current subband into vectors according to the number of the coefficients to be encoded contained in the current subband, a flatness of a current coefficient to be encoded of the current subband can be determined based, on coefficients that have been encoded; then, according to the number of the coefficients to be encoded of the current subband and the flatness of the current coefficient to be encoded, at least one dimension vector is selected from at least two dimension vectors to partition the current coefficient to be encoded of the current subband and coefficients right adjacent to the current coefficient to be encoded into a vector. Wherein, the flatness reflects a degree of flatness of the frequency spectrum, and can be represented with various mathematic characters, such as variance, etc. The embodiments of this invention do not have limitation on the representation of flatness, so long as it can reflect the degree of flatness of the frequency spectrum.

Particularly, if the number of the coefficients to be encoded contained in the current subband is 4, the current coefficient to be encoded of the current subband and 3 sequential coefficients right adjacent to the current coefficient to be encoded can be partitioned into a 4-dimensional vector; alternatively, if the number of the coefficients to be encoded contained in the current subband is larger than 4, and the flatness of the current coefficient to be encoded is less than a first preset threshold, the current coefficient to be encoded of the current subband and 7 sequential coefficients right adjacent to the current coefficient to be encoded can be partitioned into a 8-dimensional vector; alternatively, if the number of the coefficients to be encoded contained in the current subband is larger than 4, and the flatness of the current coefficient to be encoded is not less than the first preset threshold described above, the current coefficient to be encoded of the current subband and 3 sequential coefficients right adjacent to the current coefficient to be encoded can be partitioned into a 4-dimensional vector. Wherein, the first preset threshold can be set arbitrarily according to encoding performance requirements, and the embodiments of this invention do not have limitation on the value of the first preset threshold.

In another implementation of the this embodiment, if the number of the coefficients to be encoded of the current subband is a multiple of 8, the coefficients to be encoded of the current subband can be partitioned into a first number of 8-dimensional vectors, the first number being the quotient of the number of the coefficients to be encoded of the current subband divided, by 8; alternatively, if the number of the coefficients to be encoded of the current subband is not a multiple of 8, the coefficients to be encoded of the current subband can be partitioned into a second number of 8-dimensional vectors and one 4-dimensional vector, the second number being the quotient of the difference value of the number of the coefficients to be encoded of the current subband subtracting 4 divided by 8.

At step 102, according to the selected dimension, the vectors partitioned from the coefficients to be encoded are quantized into lattice vectors, and then the lattice vectors are mapped to lattice index vectors.

In this embodiment, quantizing the vectors partitioned from the coefficients to be encoded into lattice vectors according to the selected dimension particularly comprises: quantizing 8-dimensional vectors into E8 lattice vectors; and/or quantizing 4-dimensional vectors into D4 lattice vectors. Wherein, D4 lattice vectors are optimal 4-dimensional lattice points, and E8 lattice vectors are optimal 8-dimensional lattice points.

The D4 lattice is one of Dn lattices, a Dn lattice is defined as a n-dimensional vector $\{x_1, x_2, \ldots, x_n\}$, each component of the above n-dimensional vector is an integer, and the sum of all of the components is an even, for example, $\{1, -1, 2, 0\}$. A E8 lattice is defined as $$E_8 = D_8 \cup \left\{ D_8 + \left[ \frac{1}{2}, \frac{1}{2}, \frac{1}{2}, \frac{1}{2}, \frac{1}{2}, \frac{1}{2}, \frac{1}{2}, \frac{1}{2} \right] \right\}.$$

In short, part of E8 lattices are D8 lattices; other part of E8 lattices are 8-dimensional vectors $\{x_1, x_2, \ldots, x_8\}$ satisfying $x_i \in Z+0.5$, i=1, ..., n, wherein Z represents the set of integers, and the sum of respective component of such a 8-dimensional vector is an even.

In this embodiment, there is one-to-one correspondence between lattice vectors and lattice index vectors. A lattice vector is defined as X, and a lattice index vector corresponding to X is K. For D4 and E8 lattices, there is a generation matrix G and a reverse matrix $G^{-1}$ of the generation matrix G, satisfying:

$$\left. \begin{array}{l} K = X \cdot G^{-1} \\ X = K \cdot G \end{array} \right\} \quad (1)$$

Therefore, in this embodiment, the mapping from a lattice vector to a lattice index vector is reversible.

Particularly, a generation vector $G_{D4}$ of a D4 lattice and the reverse matrix of the generation vector $G_{D4}$ are represented as follows:

$$\left. \begin{array}{l} G_{D4} = \begin{bmatrix} 2 & 0 & 0 & 0 \\ 1 & 1 & 0 & 0 \\ 1 & 0 & 1 & 0 \\ 1 & 0 & 0 & 1 \end{bmatrix} \\ G_{D4}^{-1} = \begin{bmatrix} 0.5 & 0 & 0 & 0 \\ -0.5 & 1 & 0 & 0 \\ -0.5 & 0 & 1 & 0 \\ -0.5 & 0 & 0 & 1 \end{bmatrix} \end{array} \right\} \quad (2)$$

A generation vector $G_{E8}$ of an E8 lattice and the reverse matrix of the generation vector $G_{E8}$ are represented as follows:

$$\left. \begin{array}{l} G_{E8} = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 0.5 & 0.5 & 0.5 & 0.5 & 0.5 & 0.5 & 0.5 & 0.5 \end{bmatrix} \\ G_{E8}^{-1} = \begin{bmatrix} 0.5 & 0 & 0 & 0 & 0 & 0 & 0 & 0 \\ -0.5 & 1 & 0 & 0 & 0 & 0 & 0 & 0 \\ -0.5 & 0 & 1 & 0 & 0 & 0 & 0 & 0 \\ -0.5 & 0 & 0 & 1 & 0 & 0 & 0 & 0 \\ -0.5 & 0 & 0 & 0 & 1 & 0 & 0 & 0 \\ -0.5 & 0 & 0 & 0 & 0 & 1 & 0 & 0 \\ -0.5 & 0 & 0 & 0 & 0 & 0 & 1 & 0 \\ 2.5 & -1 & -1 & -1 & -1 & -1 & -1 & 2 \end{bmatrix} \end{array} \right\} \quad (3)$$

At step 103, lossless encoding is performed on the lattice index vectors.

In one implementation of this embodiment, at step 102, before quantizing the vectors partitioned from the coefficients to be encoded into lattice vectors according to the selected dimension, it also possible to firstly determine the absolute values of the above vectors, and then quantize the absolute values of the above vectors into absolute value lattice vectors according to the selected dimension and map the absolute value lattice vectors to lattice index vectors; during this process, it is also necessary to save sign information before quantization for non-zero coefficients of the above absolute value lattice vectors, comprising signs before quantization of those non-zero coefficients, and correspondence between the signs before quantization of those non-zero coefficients and those non-zero coefficients; at last, lossless encoding is performed on the above lattice index vectors, and the sign information saved is also encoded.

In the above embodiment, the encoding side, according to the number of the coefficients to be encoded contained in a current subband, selects at least one dimension vector from at least two dimension vectors to partition the coefficients to be encoded of the current subband into vectors, quantizes the vectors partitioned from the coefficients to be encoded into lattice vectors according to the selected dimension, then maps the lattice vectors to lattice index vectors, and finally, performs lossless encoding on the lattice index vectors, so that the number of bits used in encoding is generally reduced, quantization quality, and thus, encoding efficiency and encoding quality can be improved, and a quantization method of high quality is provided suitable for signal types including music signals.

Figure 2:
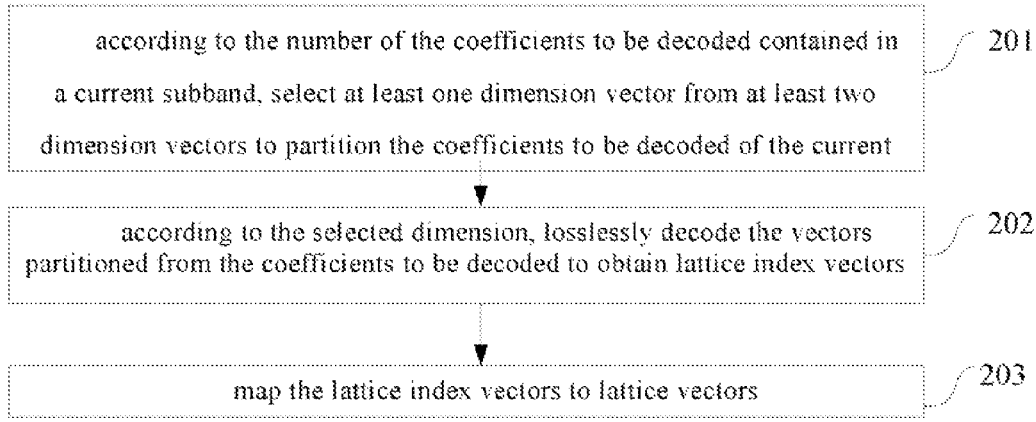
FIG. 2 is a flow chart of a decoding method according to one embodiment of this invention.

FIG. 2 is a flow chart of a decoding method according to one embodiment of this invention. As shown in FIG. 2, the decoding method comprises the following steps.

At step 201, according to the number of the coefficients to be decoded contained in a current subband, at least one dimension vector is selected from at least two dimension vectors to partition the coefficients to be decoded of the current subband into vectors.

Wherein, the at least two dimension vectors described above may comprise 4-dimensional vector, 6-dimensional vector, 8-dimensional vector, and other vectors; the at least one dimension vector selected from the at least two dimension vectors described above may be 4-dimensional vector, 6-dimensional vector, 8-dimensional vector, etc. The embodiments of this invention are not limited thereto; however, a selected 4-dimensional vector and 8-dimensional vector will be described as an example in this embodiment of the present invention, because, for mainstream audio decoders, the number of the coefficients to be decoded, contained in a subband is generally a multiple of 4 or 8.

In one implementation of this embodiment, before partitioning coefficients to be decoded of a current subband according to the number of the coefficients to be decoded contained in the current subband, the flatness of a current coefficient to be decoded of the current subband can be determined based on decoded coefficients; then, according to the number of the coefficients to be decoded of the current subband and the flatness of the current coefficient to be decoded, at least one dimension vector is selected from at least two dimension vectors to partition the current coefficient to be decoded of the current subband and coefficients right adjacent to the current coefficient to be decoded into vectors. Wherein, the flatness reflects a degree of flatness of the frequency spectrum, and can be represented with various mathematic characters, such as variance, etc. The embodiments of this invention do not have limitation on the representation of flatness, so long as it can reflect a degree of flatness of the frequency spectrum.

Particularly, if the number of the coefficients to be decoded contained in the current subband is 4, the current coefficient to be decoded of the current subband and 3 sequential coefficients right adjacent to the current coefficient to be decoded can be partitioned into a 4-dimensional vector; alternatively, if the number of the coefficients to be decoded contained in the current subband is larger than 4, and the flatness of the current coefficient to be decoded is less than a second preset threshold, the current coefficient to be decoded of the current subband and 7 sequential coefficients right adjacent to the current coefficient to be decoded can be partitioned into a 8-dimensional vector; alternatively, if the number of the coefficients to be decoded contained in the current subband is larger than 4, and the flatness of the current coefficient to be decoded is not less than the second preset threshold described above, the current coefficient to be decoded of the current subband and 3 sequential coefficients right adjacent to the current coefficient to be decoded can be partitioned into a 4-dimensional vector. Wherein, the second preset threshold can be set arbitrarily according to decoding performance requirements, and the embodiments of this invention do not have limitation on the value of the second preset threshold. In this embodiment, the second preset threshold may have the same value as the first threshold in the embodiment as shown in FIG. 1.

In another implementation of the this embodiment, if the number of the coefficients to be decoded of the current subband is a multiple of 8, the coefficients to be decoded of the current subband can be partitioned into a third number of 8-dimensional vectors, the third number being the quotient of the number of the coefficients to be decoded of the current subband divided by 8; alternatively, if the number of the coefficients to be decoded of the current subband is not a multiple of 8, the coefficients to be decoded of the current subband can be partitioned into a fourth number of 8-dimensional vectors and one 4-dimensional vector, the fourth number being the quotient of the difference value of the number of the coefficients to be decoded of the current subband subtracting 4 divided by 8.

At step 202, according to the selected dimension, the vectors partitioned from the coefficients to be decoded are decoded losslessly to obtain lattice index vectors.

Particularly, the above 8-dimensional vectors can be decoded losslessly to obtain 8-dimensional lattice index vectors; and/or the above 4-dimensional vectors can be decoded losslessly to obtain 4-dimensional lattice index vectors.

At step 203, the lattice index vectors can be mapped to lattice vectors.

Particularly, the 8-dimensional lattice index vectors can be mapped to E8 lattice vectors, and/or the 4-dimensional lattice index vectors can be mapped to D4 lattice vectors to complete coefficient reconstruction.

Wherein the definitions of D4 lattice vectors and E8 lattice vectors are the same as those described at step 102 of the embodiment shown in FIG. 1, the mapping correspondence between lattice index vectors and lattice vectors is the same as that described in connection with equations (1) to (3), thus they will not be described in detail herein.

In one implementation of this embodiment, if the lattice vectors mapped from the lattice index vectors are absolute value lattice vectors, it is also necessary to decode symbols saving sign information before quantization of non-zero coefficients of the above absolute value lattice vectors, so as to obtain signs before quantization of those non-zero coefficients, and the correspondence between the signs before quantization of those non-zero coefficients and those non-zero coefficients; according to the correspondence, signs before quantization of the non-zero coefficients are assigned to corresponding non-zero coefficients to complete coefficient reconstruction.

In the above embodiment, the decoding side, according to the number of the coefficients to be decoded contained in a current subband, selects at least one dimension vector from at least two dimension vectors to partition the coefficients to be decoded of the current subband into vectors, then losslessly decodes the vectors partitioned from the coefficients to be decoded according to the selected dimension to obtain lattice index vectors, and maps the lattice index vectors to lattice vectors to complete coefficient reconstruction. Thereby, quantization quality, and thus, decoding efficiency and decoding quality can be improved, and a quantization method of high quality is provided suitable for signal types including music signals.

Hereinafter, in combination with FIGS. 3 to 7, the encoding method and decoding method provided in embodiments of this invention will be described in detail. Wherein, the embodiment shown in FIG. 3, FIG. 4 and FIG. 6 describes the encoding of a frequency domain (FD in short hereinafter) branch of music signals by the encoding side of a Moving Pictures Experts Group Unified Speech and Audio Coding (USAC in short) encoder as an example; the embodiment shown in FIG. 5 and FIG. 7 describes the decoding of the FD branch of the music signals by the decoding side of the USAC encoder as an example. Certainly, the embodiments of this invention do not limited thereto, the USAC encoder can also be used to process a time domain (TD in short hereinafter) branch of audio signals. For a TD branch, there is a sub-module in the USAC encoder for processing residual coefficients after TD encoding. The residual coefficients can be processed through the method provided in the embodiment of this invention, particularly, in the same manner as that for a FD branch, which will not be described in detail herein.

Figure 3:
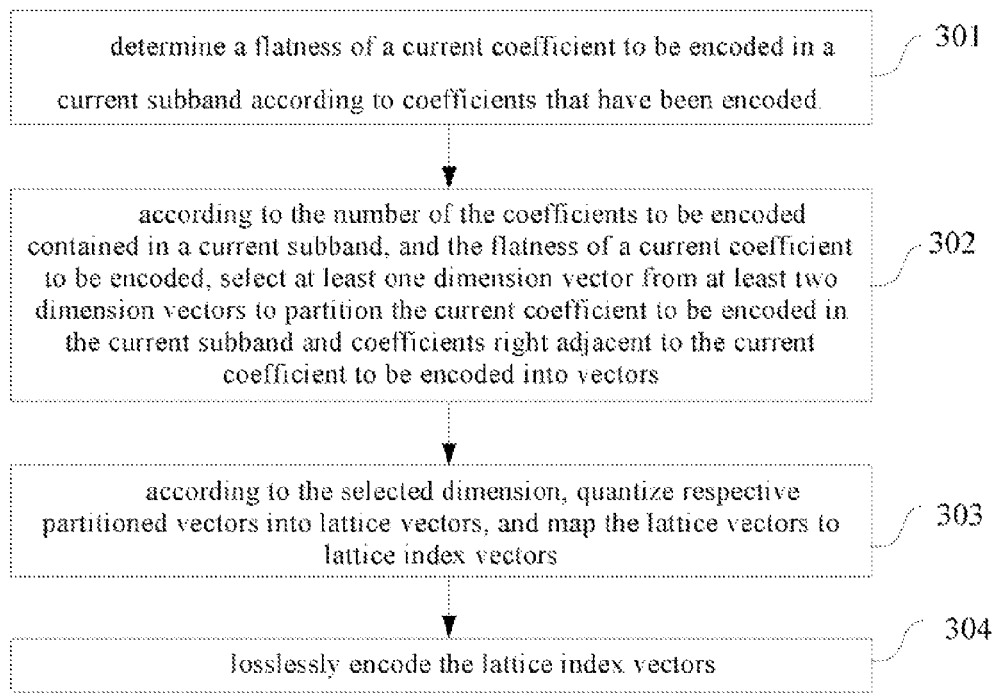
FIG. 3 is a flow chart of an encoding method according to another embodiment of this invention.

FIG. 3 is a flow chart of an encoding method according to another embodiment of this invention. As shown in FIG. 3, the encoding method may comprise the following steps.

At step 301, the flatness of a current coefficient to be encoded in a current subband is determined according to coefficients that have been encoded.

In this embodiment, subbands of a FD branch are divided in a USAC encoder in a fixed manner, i.e., in an order from the lowest frequency to the highest frequency for both quantization and encoding. For each subband, it is assumed that the number of the coefficients to be encoded contained in each subband is L. In the USAC encoder, the number of the coefficients to be encoded contained in each subband is restricted to a multiple of 4.

Wherein, the flatness reflects a degree of flatness of the frequency spectrum, and can be characterized by many mathematic characters, for example, variance; the embodiments of this invention do not have limitation on the representation of flatness, so long as it can reflect the degree of flatness of the frequency spectrum. In this embodiment, assume that N adjacent coefficients to be encoded form an array $\{x_0, x_1, \ldots, x_{N-1}\}$, then a flatness $P(x_i)$ can be represented as:

$$P(x_i) = \frac{\sum_{i=0}^{N-1} |x_i|}{N \cdot \max |x_i|} \quad (4)$$

wherein, i=0, 1, . . . , N−1.

$P(x_i)$ is compared with a first preset threshold THD, if $P(x_i)$<THD, the frequency spectrum is relatively flatter; otherwise, if $P(x_i) \geq$ THD, the frequency spectrum has larger surges.

According to the correlation between signals, in time domain or frequency domain, adjacent subbands have approximate properties. For example, assuming that the $i^{th}$ frame in the $j^{th}$ subband has a flatter frequency spectrum, it is very likely for the $i+1^{th}$ frame in the $j^{th}$ subband to also have a flatter frequency spectrum. Similarly, adjacent subbands also have similar correlation in frequency domain.

When assuming the current coefficient to be encoded is the $j^{th}$ coefficient $x_{i,j}$ of the $i^{th}$ frame, the flatness of the current coefficient $x_{i,j}$ to be encoded in a current subband can be determined according to coefficients that have been encoded as:

$$P(x_{i,j}) = \alpha_0 \cdot P(x_{i-1,j}) + \alpha_1 \cdot P(x_{i,j-8}) \quad (5)$$

In equation (5), $P(x_{i,j})$ is the flatness of the current coefficient $x_{i,j}$ to be encoded and 7 sequential coefficients $\{x_{i,j}, x_{i,j+1}, \ldots, x_{i,j+7}\}$ right adjacent to $x_{i,j}$; $P(x_{i-1,j})$ is the flatness of the $j^{th}$ coefficient $x_{i-1,j}$ of the $i-1^{th}$ frame and 7 sequential coefficients $\{x_{i-1,j}, x_{i-1,j+1}, \ldots, x_{i-1,j+7}\}$ right adjacent to $x_{i-1,j}$; $P(x_{i,j-8})$ is the flatness of 8 sequential coefficients $\{x_{i,j-8}, x_{i,j-7}, \ldots, x_{i,j-1}\}$ left adjacent to the $j^{th}$ coefficient $x_{i,j}$ of the $i^{th}$ frame; $\alpha_0$ and $\alpha_1$ are decimal fractions between 0 and 1, reflecting influence weights of the above two components $P(x_{i-1,j})$ and $P(x_{i,j-8})$ on $P(x_{i,j})$. In practical applications, $\alpha_0$ and $\alpha_1$ are predetermined constants. Furthermore, a boundary condition should be considered, i.e., for coefficients to be encoded at the start stage of each frame, only related information of some adjacent coefficients to be encoded can be obtained in frequency domain. Under such a boundary condition, $\alpha_0$ and $\alpha_1$ are forcedly set to 1 and 0 respectively.

At step 302, according to the number of the coefficients to be encoded contained in a current subband, and the flatness of a current coefficient to be encoded, at least one dimension vector is selected from at least two dimension vectors to partition the current coefficient to be encoded in the current subband and coefficients right adjacent to the current coefficient to be encoded into a vector.

The vector partition operation at step 302 will be described in detail in combination with FIG. 4.

Figure 4:
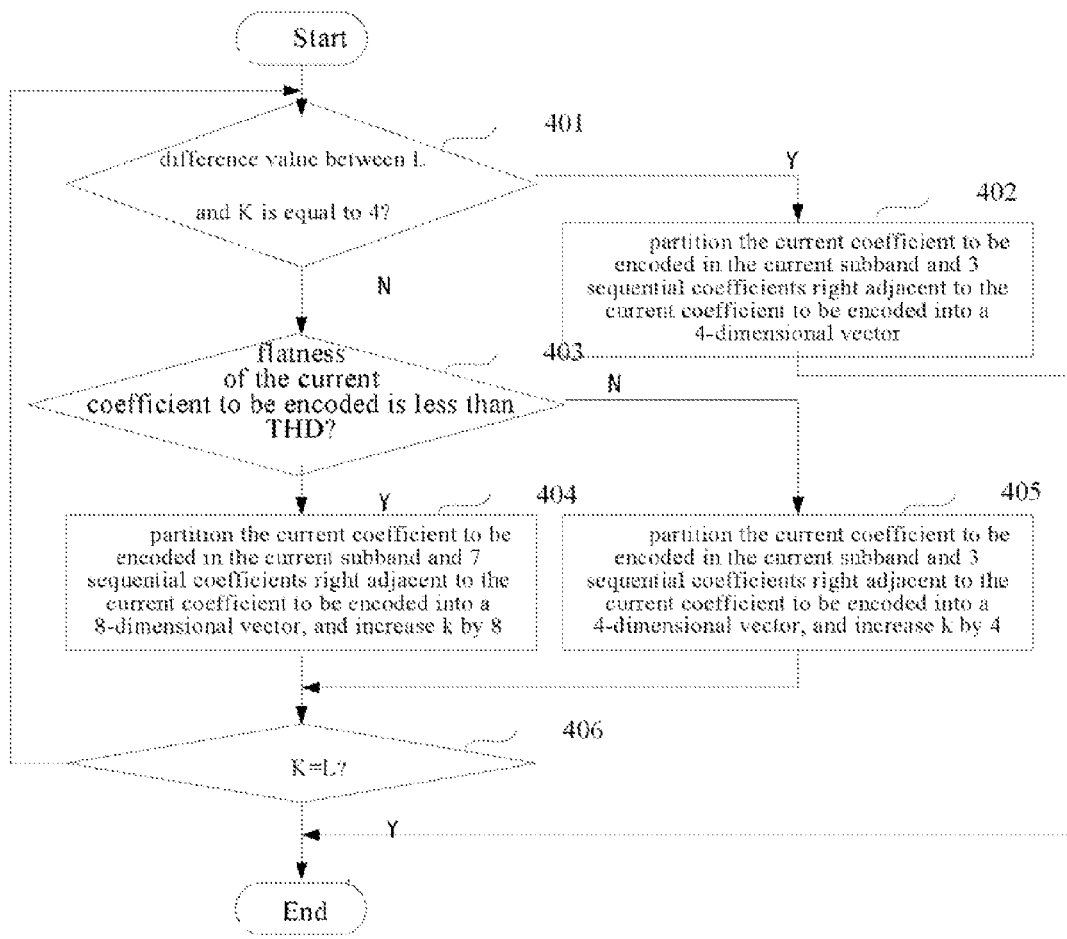
FIG. 4 is a flow chart of a vector partitioning method according to one embodiment of this invention.

FIG. 4 is a flow chart of a vector partition method according to one embodiment of this invention. In the embodiment shown in FIG. 4, it is assumed that the total number of coefficients to be encoded contained in a current subband is L, the number of the coefficients that have been encoded is k, and the first preset threshold is THD.

As shown in FIG. 4, the vector partition method may comprise the following steps.

At step 401, it is determined whether the difference between L and K is equal to 4. If so, the step 402 is executed; if the difference between L and K is larger than 4, the step 403 is executed.

At step 402, the current coefficient to be encoded in the current subband together with 3 sequential coefficients right adjacent to the current coefficient to be encoded is partitioned into a 4-dimensional vector, and then the flow finishes.

For example, suppose the current coefficient to be encoded in the current subband is $x_{i,j}$, $\{x_{i,j}, x_{i,j+1}, x_{i,j+2}, x_{i,j+3}\}$ can be partitioned in a 4-dimensional vector.

At step 403, it is determined whether the flatness of the current coefficient to be encoded is less than THD; if so, the step 404 is executed; if the flatness of the current coefficient to be encoded is not less than THD, the step 405 is executed.

Wherein, THD can be specified arbitrarily according to encoding performance requirements, and the embodiments of this invention do not have limitation on the value of THD.

At step 404, the current coefficient to be encoded in the current subband together with 7 sequential coefficients right adjacent to the current coefficient to be encoded is partitioned into a 8-dimensional vector, and k is increased by 8, then the step 406 is executed.

For example, assuming the current coefficient to be encoded in the current subband is $x_{i,j}$, $\{x_{i,j}, x_{i,j+1}, \ldots, x_{i,j+7}\}$ can be partitioned into a 8-dimensional vector.

At step 405, the current coefficient to be encoded in the current subband together with 3 sequential coefficients right adjacent to the current coefficient to be encoded is partitioned into a 4-dimensional vector, and k is increased by 4, then the step 406 is executed.

For example, assuming the current coefficient to be encoded in the current subband is $x_{i,j}$, $\{x_{i,j}, x_{i,j+1}, x_{i,j+2}, x_{i,j+3}\}$ can be partitioned into a 4-dimensional vector.

At step 406, it is determined whether k is equal to L. If so, the flow ends; if L is larger than k, the flow returns to step 401.

Thus, the operation of vector partition of this embodiment completes.

At step 303, according to the selected dimension, respective partitioned vectors are quantized into lattice vectors, and the lattice vectors are mapped to lattice index vectors.

In the embodiment, each vector partitioned is quantized one by one. For a 8-dimensional vector, it is first quantized to a E8 lattice vector, then a lattice index vector corresponding to the E8 lattice vector is computed with reference to equations (1) and (3); for a 4-dimensional vector, the 4-dimensional vector is firstly quantized to a D4 lattice vector, then a lattice index vector corresponding to the D4 lattice vector is computed with reference to equations (1) and (2).

At step 304, those lattice index vectors are encoded losslessly.

Particularly, in the lossless encoding, either individual components of a lattice index vector can be encoded separately, or multiple components of a lattice index vector can be jointly encoded. Particularly, in the lossless encoding of lattice index vectors, an arithmetic encoding module in the USAC encoder can be invoked.

Finally, after all subbands to be processed have been quantized and encoded, code streams are merged, and then the operation of the encoding side is accomplished.

In the above embodiment, the encoding side, according to the number of the coefficients to be encoded contained in a current subband and the flatness of the current coefficients to be encoded, selects at least one dimension vector from at least two dimension vectors to partition the coefficients to be encoded of the current subband into vectors, quantizes the vectors partitioned from the coefficients to be encoded into lattice vectors, and then maps the lattice vectors to lattice index vectors, at last, performs lossless encoding on the lattice index vectors so that the number of bits used in encoding is generally reduced; quantization quality, and thus, encoding efficiency and encoding quality can be improved, and a quantization method of high quality is provided suitable for signal types including music signals.

Figure 5:
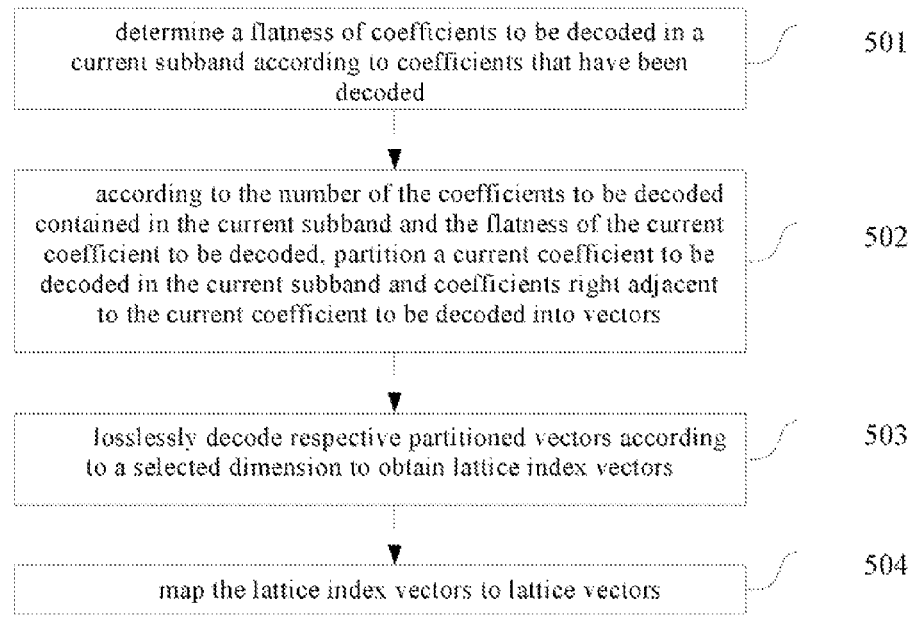
FIG. 5 is a flow chart of a decoding method according to another embodiment of this invention.

FIG. 5 is a flow chart of a decoding method according to another embodiment of this invention. As shown in FIG. 5, the decoding method may comprise the following steps.

At step 501, the flatness of coefficients to be decoded in a current subband is determined according to coefficients that have been decoded.

Particularly, the flatness of coefficients to be decoded in a current subband can be determined through the method provided at step 301 of the embodiment shown in FIG. 3, which will not be described in detail herein.

At step 502, according to the number of the coefficients to be decoded contained in the current subband and the flatness of the current coefficient to be decoded, at least one dimension vector is selected from at least two dimension vectors to partition a current coefficient to be decoded in the current subband and coefficients right adjacent to the current coefficient to be decoded into a vector.

Particularly, a current coefficient to be decoded in the current subband and coefficients right adjacent to the current coefficient to be decoded can be partitioned into a vector through the method provided in the embodiment shown in FIG. 4, which will not be described in detail herein.

At step 503, respective vectors partitioned can be decoded losslessly according to a selected dimension to obtain lattice index vectors.

Particularly, 8-dimensional vectors can be decoded losslessly to obtain 8-dimensional lattice index vectors; and/or 4-dimensional vectors can be decoded losslessly to obtain 4-dimensional lattice index vectors.

At step 504, lattice index vectors are mapped into lattice vectors.

In this embodiment, for 8-dimensional lattice index vectors, lattice vectors corresponding to the 8-dimensional lattice index vectors can be computed with reference to equations (1) and (3); for 4-dimensional lattice index vectors, lattice vectors corresponding to the 4-dimensional lattice index vectors can be computed with reference to equations (1) and (2) so that the reconstruction of frequency coefficients is completed on the decoding side.

In the above embodiment, the decoding side, according to the number of the coefficients to be decoded contained in a current subband and the flatness of the current coefficient to be decoded, selects at least one dimension vector from at least two dimension vectors to partition the coefficients to be decoded of the current subband into vectors, then losslessly decodes the vectors partitioned from the coefficients to be decoded to obtain lattice index vectors, and maps the lattice index vectors to lattice vectors to complete coefficient reconstruction. Thereby, quantization quality, and thus, decoding efficiency and decoding quality can be improved, and a high quality quantization method is provided suitable for signal types including music signals.

Figure 6:
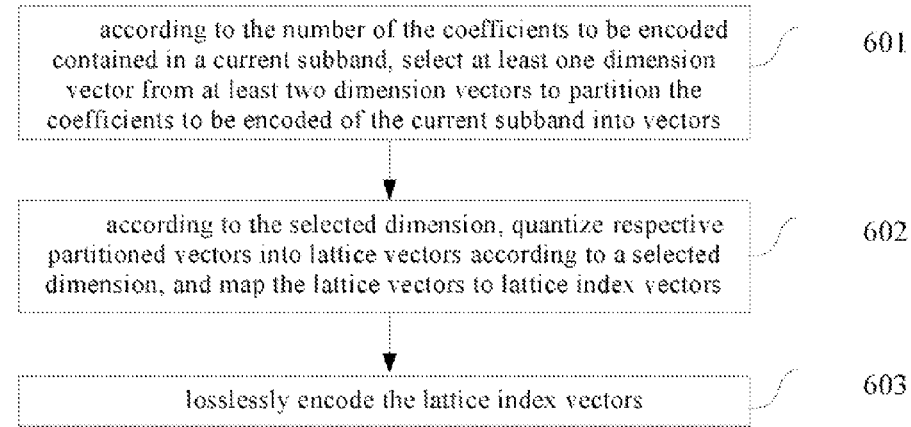
FIG. 6 is a flow chart of an encoding method according to still another embodiment of this invention.

FIG. 6 is a flow chart of an encoding method according to still another embodiment of this invention. As shown in FIG. 6, the encoding method may comprise the following steps.

At step 601, according to the number of the coefficients to be encoded contained in a current subband, at least one dimension vector is selected from at least two dimension vectors to partition the coefficients to be encoded of the current subband into vectors.

Particularly, if the number of the coefficients to be encoded contained in the current subband is a multiple of 8, the coefficients to be encoded in the current subband can be partitioned into a first number of 8-dimensional vectors, the first number being the quotient of the number of the coefficients to be encoded contained in the current subband divided by 8; alternatively, if the number of the coefficients to be encoded contained in the current subband is not a multiple of 8, the coefficients to be encoded of the current subband can be partitioned into a second number of 8-dimensional vectors and one 4-dimensional vector, the second number being the quotient of the difference value of the number of the coefficients to be encoded of the current subband subtracting 4 divided by 8.

For example, assuming the number of the coefficients to be encoded contained in the current subband is L, if L is a multiple of 8, that is L can be exactly divided by 8, the L coefficients to be encoded can be partitioned into $$\frac{L}{8}$$

8-dimensional vectors wherein $$\frac{L}{8}$$

is the first number; if L is not a multiple of 8, that is, L can not be exactly divided by 8, the L coefficients to be encoded are decomposed into $$\frac{L-4}{8}$$

8-dimensional vectors and one 4-dimensional vector, wherein, $$\frac{L-4}{8}$$

is the second number.

At step 602, respective vectors partitioned are quantized into lattice vectors according to a selected dimension, and then the lattice vectors are mapped to lattice index vectors.

In this embodiment, respective vectors partitioned may be sequentially quantized into lattice vectors, which are then mapped into lattice index vectors.

For example, assuming that the coefficients to be encoded contained in the current subband are partitioned into M vectors. Firstly, the first M−1 vectors may be quantized into M−1 E8 lattice vectors, and then lattice index vectors corresponding to the E8 lattice vectors are computed with reference to equations (1) and (3). For the last vector, if it is a 8-dimensional vector, it can be quantized into a E8 lattice vector at first, and then a lattice index vector corresponding to the E8 lattice vector can be computed with reference to equations (1) and (3); if the last vector is a 4-dimensional vector, it can be quantized into a D4 lattice vector at first, and then a lattice index vector corresponding to the D4 lattice vector can be computed with reference to equations (1) and (2).

At step 603, the lattice index vectors are encoded losslessly,

Particularly, in the lossless encoding, either individual components of a lattice index vector can be encoded separately, or multiple components of a lattice index vector can be jointly encoded. Particularly, in the lossless encoding of lattice index vectors, an arithmetic encoding module in the USAC encoder can be invoked Finally, after all subbands to be processed have been quantized and encoded, code streams are merged, and then the operation of the encoding side is accomplished.

In the above embodiment, the encoding side, according to the number of the coefficients to be encoded contained in a current subband, selects at least one dimension vector from at least two dimension vectors to partition the coefficients to be encoded of the current subband into vectors, quantizes the vectors partitioned from the coefficients to be encoded into lattice vectors, and then maps the lattice vectors to lattice index vectors, at last, performs lossless encoding on the lattice index vectors, so that the number of bits used in encoding is generally reduced; quantization quality, and thus, encoding efficiency and encoding quality can be improved, and a quantization method of high quality is provided suitable for signal types including music signals.

Figure 7:
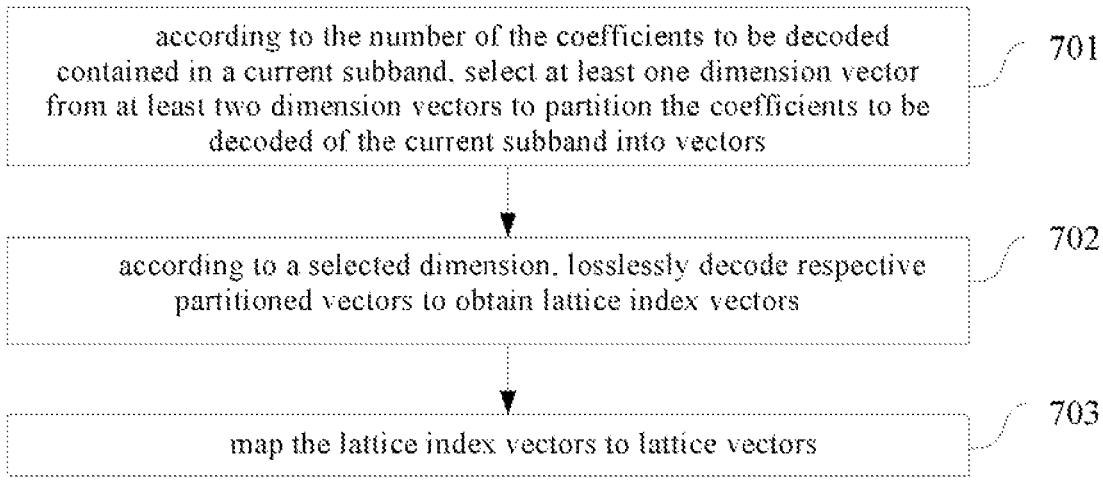
FIG. 7 is a flow chart of a decoding method according to still another embodiment of this invention.

FIG. 7 is a flow chart of a decoding method according to still another embodiment of this invention. As shown in FIG. 7, the decoding method may comprise the following steps.

At step 701, according to the number of the coefficients to be decoded contained in a current subband, at least one dimension vector is selected from at least two dimension vectors to partition the coefficients to be decoded of the current subband into vectors.

Particularly, if the number of the coefficients to be decoded contained in the current subband is a multiple of 8, the coefficients to be decoded of the current subband can be partitioned into a third number of 8-dimensional vectors, the third number being the quotient of the number of the coefficients to be decoded of the current subband divided by 8; alternatively, if the number of the coefficients to be decoded of the current subband is not a multiple of 8, the coefficients to be decoded of the current subband can be partitioned into a fourth number of 8-dimensional vectors and one 4-dimensional vector, the fourth number being the quotient of a difference value of the number of the coefficients to be decoded of the current subband subtracting 4 divided by 8.

For example, assuming the number of the coefficients to be decoded of the current subband is L, if L, is a multiple of 8, that is, L can be exactly divided by 8, the L coefficients to be decoded can be partitioned into $$\frac{L}{8}$$

8-dimensional vectors, wherein $$\frac{L}{8}$$

is the third number; if L is not a multiple of 8, that is, L can not be exactly divided by 8, the L coefficients to be decoded are decomposed into $$\frac{L-4}{8}$$

8-dimensional vectors and one 4-dimensional vector, wherein, $$\frac{L-4}{8}$$

is the fourth number

At step 702, according to a selected dimension, respective vectors partitioned are decoded losslessly to obtain lattice index vectors.

Particularly, the 8-dimensional vectors described above may be decoded losslessly to obtain 8-dimensional lattice index vectors; and/or the 4-dimensional vectors described above may be decoded losslessly to obtain 4-dimensional lattice index vectors.

In this embodiment, in the lossless decoding, either all lattice index vectors may be decoded losslessly at one time, or lattice index vectors may be decoded losslessly individually. Specifically, in the lossless decoding, an arithmetic decoding module in a USAC decoder can be invoked.

At step 703, the lattice index vectors are mapped to lattice vectors.

Particularly, 8-dimensional lattice index vectors may be mapped to E8 lattice vectors, and/or 4-dimensional lattice index vectors may be mapped to D4 lattice vectors, to complete the reconstruction of the frequency coefficients.

In this embodiment, assuming that the current subband contains M lattice index vectors. For the first M−1 lattice index vectors, lattice vectors corresponding to the M−1 8-dimensional lattice index vectors can be computed with reference to equations (1) and (3). For the last lattice index vector, if it is a 8-dimensional lattice index vector, a lattice vectors corresponding to the last lattice index vector can be computed with reference to equations (1) and (3); if it is a 4-dimensional lattice index vector, a lattice vectors corresponding to the last lattice index vector can be computed with reference to equations (1) and (2), so that the frequency coefficient reconstruction is accomplished on the decoding side.

In the above embodiment, the decoding side, according to the number of the coefficients to be decoded contained in a current subband, selects at least one dimension vector from at least two dimension vectors to partition the coefficients to be decoded of the current subband into vectors, then losslessly decodes the vectors partitioned from the coefficients to be decoded to obtain lattice index vectors, and maps the lattice index vectors to lattice vectors to complete frequency coefficient reconstruction. Thereby, quantization quality, and thus, decoding efficiency and decoding quality can be improved, and a quantization method of high quality is provided suitable for signal types including music signals.

With reference to equation (3), the reverse matrix of the E8 lattice generation matrix has a "counteraction" effect. If 8-dimensional vectors to be quantized have the same sign, the amplitudes of the quantized lattice vectors must be reduced. Therefore, in the embodiment shown in FIGS. 3 and 6, signs can be separated from the vectors partitioned from the coefficients to be encoded before quantization, to determine the absolute values of those vectors. Then, the absolute values of the vectors described above are quantized to absolute value lattice vectors, which are mapped to lattice index vectors. In some cases, vectors partitioned from coefficients to be encoded have some components with relative small amplitude, for example, vectors partitioned from coefficients to be encoded have some components with amplitude less than 1. Before quantizing the absolute values of the vectors described above to absolute value lattice vectors, signs of components having smaller amplitude can be saved; if those components having smaller amplitude are quantized to zero after quantization, the signs of the components having smaller amplitude do not need to be saved any longer, and only signs before quantization of non-zero coefficients of the absolute value lattice vectors after quantization are saved. The sign information comprises signs before quantization of the non-zero coefficients described above, and correspondence between the signs before quantization of the non-zero coefficients and the non-zero coefficients. After that, the lattice index vectors described above are encoded losslessly, and the saved sign information is encoded as well.

The code stream structure obtained through the above operation, as compared to the code stream structure obtained through the embodiment shown in FIGS. 3 and 6, may further have additional bits for saving sign information before quantization of non-zero coefficients of absolute value lattice vectors after quantization.

Correspondingly, in the embodiment shown in FIG. 5 and FIG. 7 on the decoding side, if lattice vectors mapped from lattice index vectors are absolute value lattice vectors, it is also necessary to decode symbols saving sign information before quantization of non-zero coefficients of the absolute value lattice vectors, to obtain the signs before quantization of the non-zero coefficients, and the correspondence between the signs before quantization of the non-zero coefficients and the non-zero coefficients; the signs before quantization of the non-zero coefficients are assigned to corresponding non-zero coefficients according to the correspondence to complete coefficient reconstruction.

One key point of the embodiment of this invention is that the quantization output is no longer lattice vectors, but lattice index vectors, thereby the restriction of trained statistic-based base codebooks can be thoroughly removed, making the quantization suitable for the process of music signals.

For example, X1: {4,4,0,2,2,0,0,0} is a Q4 codebook falling within existing base codebooks, and its corresponding lattice index vector is K1: {−1,2,0,1,1,0,0,0}, assuming that there is another lattice index vector K2: {−1,0,0,1,0,1,0,2}, and its corresponding lattice vector is X2: {2,2,2,4,2,4,2,2}. According to the information theory, the same number of bits will be used in the encoding of K1 and K2. If an existing multi-rate vector quantization method is adopted, X1 is within existing base codebooks, but X2 is not, therefore, when the above lattice vectors X1 and X2 are encoded, quite different numbers of bits will be used. In practical applications, it is very hard to represent frequency spectrum coefficient distributions of music signals with space limited base codebooks. In many cases, none of vectors to be encoded are within base codebooks. If an existing multi-rate vector quantization method is adopted, the number of bits used in the encoding of the above lattice vectors X1 and X2 will be greatly increased.

In the encoding method provided in the embodiment of this invention, however, on the encoding side, the distribution of coefficients to be encoded can be changed through a mathematic transform to remove the restriction of base codebooks, and perform lossless encoding on lattice index vectors. With the decoding method provided in the embodiment of this invention, on the decoding side, lattice index vectors are obtained through lossless decoding, and then lattice vectors are losslessly obtained by using the reversibility of the mathematic transform described above.

Furthermore, taking subband partition features of specific encoders and specific decoders into account, the encoding and decoding methods provided in the embodiments of this invention can dynamically select optimal lattice points under different dimensions, resulting in better quantization effect.

Those ordinary skilled in the art may appreciate that all or some steps of the above method embodiments can be implemented in hardware associated with program instructions, the program described previously can be stored on a computer readable storage medium, which, when being executed, will execute the steps of the above method embodiments. The storage medium described previously comprises: ROM, RAM, magnetic disks, or optical disks and various mediums capable of storing program codes.

Figure 8:
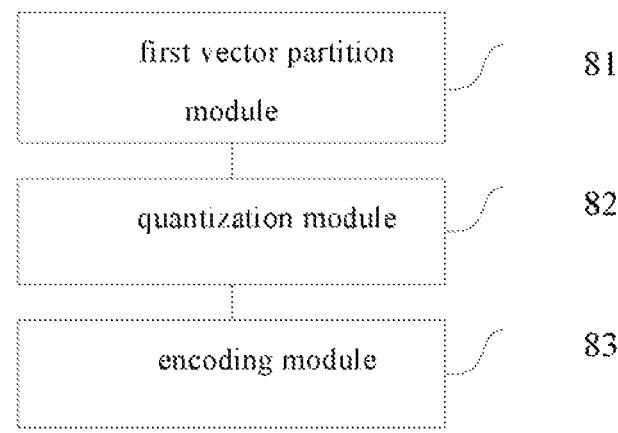
FIG. 8 is a schematic diagram of the structure of an encoder according to one embodiment of this invention.

FIG. 8 is a schematic diagram of the structure of an encoder according to one embodiment of this invention. The encoder provided in this embodiment may implement the flow of the embodiment shown in FIG. 1. As shown in FIG. 8, the encoder may comprise: a first vector partition module 81, a quantization module 82, and an encoding module 83.

Wherein the first vector partition module 81 is used to, according to the number of the coefficients to be encoded contained in a current subband, select at least one dimension vector from at least two dimension vectors to partition the coefficients to be encoded of the current subband into vectors.

In one implementation of this embodiment, the first vector partition module 81 is specifically used to, when the number of the coefficients to be encoded contained in the current subband is a multiple of 8, partition the coefficients to be encoded of the current subband into a first number of 8-dimensional vectors, the first number being the quotient of the number of the coefficients to be encoded contained in the current subband divided by 8; alternatively, when the number of the coefficients to be encoded contained in the current subband is not a multiple of 8, partition the coefficients to be encoded of the current subband into a second number of 8-dimensional vectors and one 4-dimensional vector, the second number being the quotient of a difference value of the number of the coefficients to be encoded of the current subband subtracting 4 divided by 8.

The quantization module 82 is used to quantize the vectors partitioned by the first vector partition module 81 into lattice vectors according to a selected dimension, and then map the lattice vectors to lattice index vectors. Particularly, the quantization module 82 may quantize 8-dimensional vectors to E8 lattice vectors, and/or may quantize 4-dimensional vectors to D4 lattice vectors.

The encoding module 83 is used to perform lossless encoding on the lattice index vectors described above.

Figure 9:
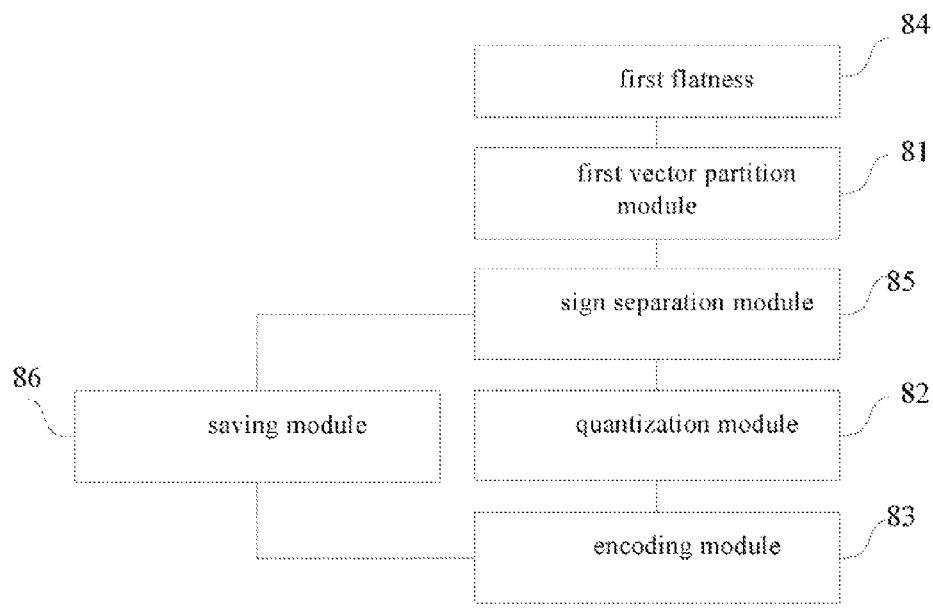
FIG. 9 is a schematic diagram of the structure of an encoder according to another embodiment of this invention.

FIG. 9 is a schematic diagram of the structure of an encoder according to another embodiment of this invention. The encoder provided in this embodiment may implement the flow of the embodiment shown in FIG. 1, FIG. 3, or FIG. 6. As compared to the encoder shown in FIG. 8, the encoder shown in FIG. 9 differs in that it further comprises: a first flatness determination module 84, a sign separation module 85, and a saving module 86.

Wherein, the first flatness determination module 84 is used to determine the flatness of a current coefficient to be encoded in the current subband according to coefficients that have been encoded; at that time, the first vector partition module 81 may, according to the number of the coefficients to be encoded contained in a current subband, and the flatness of the current coefficient to be encoded determined by the first flatness determination module 84, select at least one dimension vector from at least two dimension vectors to partition the current coefficient to be encoded of the current subband and coefficients right adjacent to the current coefficient to be encoded into vectors. Particularly, the first vector partition module 81 may, when the number of the coefficients to be encoded contained in the current subband is 4, partition the current coefficient to be encoded of the current subband and 3 sequential coefficients right adjacent to the current coefficient to be encoded into a 4-dimensional vector; alternatively, the first vector partition module 81 may, when the number of the coefficients to be encoded contained in the current subband is larger than 4, and the flatness of the current coefficient to be encoded is less than a first preset threshold, partition the current coefficient to be encoded of the current subband and 7 sequential coefficients right adjacent to the current coefficient to be encoded into a 8-dimensional vector; alternatively, the first vector partition module 81 may, when the number of the coefficients to be encoded contained in the current subband is larger than 4, and the flatness of the current coefficient to be encoded is not less than the first preset threshold described above, partition the current coefficient to be encoded of the current subband and 3 sequential coefficients right adjacent to the current coefficient to be encoded into a 4-dimensional vector. Wherein, the first preset threshold can be set arbitrarily according to encoding performance requirements, and the embodiments of this invention do not have limitation on the value of the first preset threshold.

In this embodiment, the sign separation module 85 is used to determine the absolute values of the vectors partitioned by the first vector partition module 81. At that time, the quantization module 82 may quantize the absolute values of the vectors determined by the sign separation module 85 into absolute value lattice vectors, and then map the absolute value lattice vectors to lattice index vectors.

In this embodiment, the saving module 86 is used to save sign information before quantization of the non-zero coefficients of the absolute value lattice vectors described above, comprising the signs before quantization of those non-zero coefficients, and correspondence between the signs before quantization of those non-zero coefficients and those non-zero coefficients. At that time, the encoding module 83 is used to losslessly encode the lattice index vectors described above, and encode the sign information saved by the saving module 86.

In the embodiment described above, the first vector partition module 81, according to the number of the coefficients to be encoded contained in a current subband, selects at least one dimension vector from at least two dimension vectors to partition the coefficients to be encoded of the current subband into vectors; then the quantization module 82 quantizes the vectors partitioned from the coefficients to be encoded into lattice vectors and then maps the lattice vectors to lattice index vectors; finally, the encoding module 83 performs lossless encoding on the lattice index vectors, so that the number of bits used in encoding is generally reduced, quantization quality, and thus, encoding efficiency and encoding quality can be improved, and a high quality quantization method is provided suitable for signal types including music signals.

Figure 10:
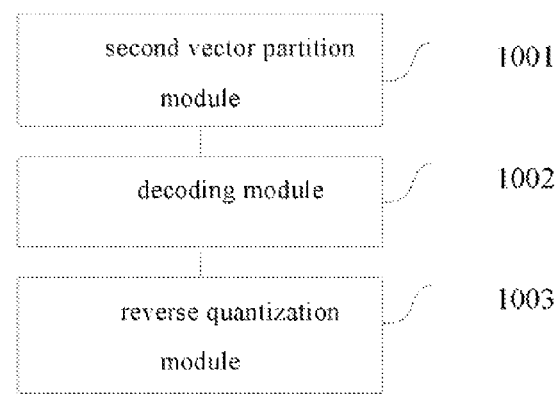
FIG. 10 is a schematic diagram of the structure of a decoder according to one embodiment of this invention.

FIG. 10 is a schematic diagram of the structure of a decoder according to one embodiment of this invention. The decoder provided in this embodiment may implement the flow of the embodiment shown in FIG. 2. As shown in FIG. 10, the decoder may comprise a second vector partition module 1001, a decoding module 1002, and a reverse quantization module 1003.

Wherein the second vector partition module 1001 is used to, according to the number of the coefficients to be decoded contained in a current subband, select at least one dimension vector from at least two dimension vectors to partition the coefficients to be decoded of the current subband into vectors.

In one implementation of this embodiment, the second vector partition module 1001 may, when the number of the coefficients to be decoded contained in the current subband is a multiple of 8, partition the coefficients to be decoded of the current subband into a third number of 8-dimensional vectors, the third number being the quotient of the number of the coefficients to be decoded contained in the current subband divided by 8; alternatively, the second vector partition module 1001 may, when the number of the coefficients to be decoded contained in the current subband is not a multiple of 8, partition the coefficients to be decoded of the current subband into a fourth number of 8-dimensional vectors and one 4-dimensional vector, the fourth number being the quotient of a difference value of the number of the coefficients to be decoded contained in the current subband subtracting 4 divided by 8.

The decoding module 1002 is used to perform lossless decoding on the vectors partitioned by the second vector partition module 1001 according to a selected dimension to obtain lattice index vectors. Particularly, the decoding module 1002 may perform lossless decoding on the 8-dimensional vectors to obtain 8-dimensional lattice index vectors; and/or the decoding module 1002 may perform lossless decoding on the 4-dimensional vectors to obtain 4-dimensional lattice index vectors.

The reverse quantization module 1003 is used to map the lattice index vectors described above to lattice vectors.

Figure 11:
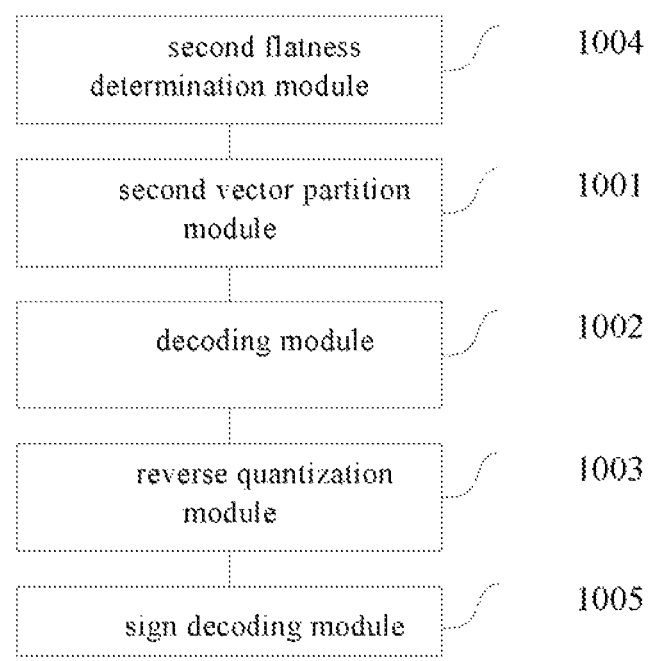
FIG. 11 is a schematic diagram of the structure of a decoder according to another embodiment of this invention.

FIG. 11 is a schematic diagram of the structure of a decoder according to another embodiment of this invention. The decoder provided in this embodiment may implement the flow of the embodiment shown in FIG. 2, FIG. 5, or FIG. 7. As compared to the decoder shown in FIG. 10, the decoder shown in FIG. 11 differs in that it further comprises a second flatness determination module 1004 and a sign decoding module 1005.

Wherein the second flatness determination module 1004 is used to determine the flatness of a current coefficient to be decoded of a current subband according to coefficients that have been decoded; at that time, the second vector partition module 1001 may, according to the number of the coefficients to be decoded contained in a current subband, and the flatness of the current coefficient to be decoded determined by the second flatness determination module 1004, select at least one dimension vector from at least two dimension vectors to partition the current coefficient to be encoded of the current subband and coefficients right adjacent to the current coefficient to be decoded into vectors. Particularly, the second vector partition module 1001 may, when the number of the coefficients to be decoded contained in the current subband is 4, partition the current coefficient to be decoded of the current subband and 3 sequential coefficients right adjacent to the current coefficient to be decoded into a 4-dimensional vector; alternatively, the second vector partition module 1001 may, when the number of the coefficients to be decoded contained in the current subband is larger than 4, and the flatness of the current coefficient to be decoded is less than a second preset threshold, partition the current coefficient to be decoded of the current subband and 7 sequential coefficients right adjacent to the current coefficient to be decoded into a 8-dimensional vector; alternatively, the second vector partition module 1001 may, when the number of the coefficients to be decoded contained in the current subband is larger than 4, and the flatness of the current coefficient to be decoded is not less than the second preset threshold described above, partition the current coefficient to be decoded of the current subband and 3 sequential coefficients right adjacent to the current coefficient to be decoded into a 4-dimensional vector. Wherein, the second preset threshold can be set arbitrarily according to decoding performance requirements, and the embodiments of this invention do not have limitation on the value of the second preset threshold. In this embodiment, the second threshold may have the same value as the first threshold of the embodiment shown in FIG. 1.

In this embodiment, the sign decoding module 1005 is used to when the lattice vectors obtained by the reverse quantization module 1003 are absolute value lattice vectors, decode symbols saving sign information before quantization of the non-zero coefficients of the absolute value lattice vectors, so as to obtain the signs before quantization of those non-zero coefficients, and the correspondence between the signs before quantization of those non-zero coefficients and those non-zero coefficients; and then according to the correspondence, assigns the signs before quantization of those non-zero coefficients to corresponding non-zero coefficients to complete coefficient reconstruction.

In the decoder described above, the second vector partition module 1001, according to the number of the coefficients to be decoded contained in a current subband, selects at least one dimension vector from at least two dimension vectors to partition the coefficients to be decoded of the current subband into vectors, then the decoding module 1002 losslessly decodes the vectors partitioned from the coefficients to be decoded according to a selected dimension to obtain lattice index vectors, and the reverse quantization module 1003 maps the lattice index vectors to lattice vectors to complete coefficient reconstruction. Thereby, quantization quality, and thus, decoding efficiency and decoding quality can be improved, and a high quality quantization method is provided suitable for signal types including music signals.

Those skilled in the art may appreciate that the accompanying drawings are merely schematic diagrams of a preferable embodiment, and modules or flows in the accompanying drawings are not necessarily needed to implement this invention.

Those skilled in the art may understand that modules in the apparatus of those embodiments can be distributed in the apparatus as described in those embodiments, or can be distributed across one or several apparatus in a manner different from that of those embodiments. Modules in the above embodiments can be combined into one module, or can be subdivided into multiple submodules.

At last, it should be noted that the above embodiments are merely given to illustrate the technical solution of this invention, and are not limitation of this invention. Although this invention has been described in detail according to the above embodiments, those skilled in the art may appreciate that modifications to the technical solution described in various embodiment or alternations of its some parts can be made; those modifications and alternations may not cause subject matters of corresponding technical solutions to depart from the spirits and scopes of the technical solutions of various embodiments of this invention.

What is claimed is:

1. An encoding method performed by an encoder, the encoding method comprising:
   determining a flatness of a current coefficient to be encoded of a current subband based on coefficients that have been encoded;
   selecting at least one dimension vector from at least two dimension vectors to partition the current coefficient to be encoded of the current subband and coefficients right adjacent to the current coefficient to be encoded into vectors, according to the number of the coefficients to be encoded contained in the current subband and the flatness of the current coefficient to be encoded;
   quantizing the vectors partitioned from the coefficients to be encoded into lattice vectors according to the selected dimension, and then mapping the lattice vectors to lattice index vectors; and
   performing lossless encoding on the lattice index vectors.

2. The method according to claim 1, wherein selecting at least one dimension vector from at least two dimension vectors to partition the current coefficient to be encoded of the current subband and coefficients right adjacent to the current coefficient to be encoded into vectors according to the number of the coefficients to be encoded contained in the current subband and the flatness of the current coefficient to be encoded comprises:
   when the number of the coefficients to be encoded contained in the current subband is 4, partitioning the current coefficient to be encoded of the current subband and 3 sequential coefficients right adjacent to the current coefficient to be encoded into a 4-dimensional vector; or,
   when the number of the coefficients to be encoded contained in the current subband is larger than 4, and the flatness of the current coefficient to be encoded is less than a first preset threshold, partitioning the current coefficient to be encoded of the current subband and 7 sequential coefficients right adjacent to the current coefficient to be encoded into a 8-dimensional vector; or
   when the number of the coefficients to be encoded contained in the current subband is larger than 4, and the flatness of the current coefficient to be encoded is not less than the first preset threshold, partitioning the current coefficient to be encoded of the current subband and 3 sequential coefficients right adjacent to the current coefficient to be encoded into a 4-dimensional vector.

3. The method according to claim 1, wherein selecting at least one dimension vector from at least two dimension vectors to partition the coefficients to be encoded of the current subband into vectors according to the number of the coefficients to be encoded contained in a current subband comprises:

when the number of the coefficients to be encoded contained in the current subband is a multiple of 8, partitioning the coefficients to be encoded of the current subband into a first number of 8-dimensional vectors, the first number being the quotient of the number of the coefficients to be encoded contained in the current subband divided by 8; or when the number of the coefficients to be encoded contained in the current subband is not a multiple of 8, partitioning the coefficients to be encoded of the current subband into a second number of 8-dimensional vectors and one 4-dimensional vector, the second number being the quotient of a difference value of the number of the coefficients to be encoded contained in the current subband subtracting 4 divided by 8.

4. The method according to claim 3, wherein quantizing the vectors partitioned from the coefficients to be encoded into lattice vectors according to the selected dimension comprises one or more of:

quantizing 8-dimensional vectors into E8 lattice vectors; or quantizing 4-dimensional vectors into D4 lattice vectors.

5. The method according to claim 1, wherein, before quantizing the vectors partitioned from the coefficients to be encoded into lattice vectors according to the selected dimension, the method further comprises:

determining the absolute values of the vectors partitioned from the coefficients to be encoded;

wherein quantizing the vectors partitioned from the coefficients to be encoded into lattice vectors according to the selected dimension, and then mapping the lattice vectors to lattice index vectors comprises:

quantizing the absolute values of the vectors to absolute value lattice vectors according to the selected dimension, and mapping the absolute value lattice vectors to lattice index vectors.

6. The method according to claim 5, further comprising:

saving sign information before quantization for the non-zero coefficients of the absolute value lattice vectors, the sign information comprising signs before quantization of the non-zero coefficients, and correspondence between the signs before quantization of the non-zero coefficients and those non-zero coefficients;

wherein performing lossless encoding on the lattice index vectors comprises:

performing lossless encoding on the lattice index vectors, and performing encoding on the saved sign information.

7. A decoding method performed by a decoder, the decoding method comprising:

determining a flatness of a current coefficient to be decoded of a current subband according to coefficients that have been decoded;

selecting at least one dimension vector from at least two dimension vectors to partition the current coefficient to be decoded of the current subband and coefficients right adjacent to the current coefficient to be encoded into vectors, according to the number of the coefficients to be decoded contained in the current subband and the flatness of the current coefficient to be decoded;

performing lossless decoding on the vectors partitioned from the coefficients to be decoded according to the selected dimension to obtain lattice index vectors; and mapping the lattice index vectors to lattice vectors.

8. The method according to claim 7, wherein selecting at least one dimension vector from at least two dimension vectors to partition the current coefficient to be decoded of the current subband and coefficients right adjacent to the current coefficient to be decoded into vectors according to the number of the coefficients to be decoded contained in the current subband and the flatness of the current coefficient to be decoded comprises:

when the number of the coefficients to be decoded contained in the current subband is 4, partitioning the current coefficient to be decoded of the current subband and 3 sequential coefficients right adjacent to the current coefficient to be decoded into a 4-dimensional vector; or, when the number of the coefficients to be decoded contained in the current subband is larger than 4, and the flatness of the current coefficient to be decoded is less than a second preset threshold, partitioning the current coefficient to be decoded of the current subband and 7 sequential coefficients right adjacent to the current coefficient to be decoded into a 8-dimensional vector; or when the number of the coefficients to be decoded contained in the current subband is larger than 4, and the flatness of the current coefficient to be decoded is not less than the second preset threshold, partitioning the current coefficient to be decoded of the current subband and 3 sequential coefficients right adjacent to the current coefficient to be decoded into a 4-dimensional vector.

9. The method according to claim 7, wherein partitioning the coefficients to be decoded of the current subband into vectors according to the number of the coefficients to be decoded contained in a current subband comprises:

when the number of the coefficients to be decoded contained in the current subband is a multiple of 8, partitioning the coefficients to be decoded of the current subband into a third number of 8-dimensional vectors, the third number being the quotient of the number of the coefficients to be decoded contained in the current subband divided by 8; or when the number of the coefficients to be decoded contained in the current subband is not a multiple of 8, partitioning the coefficients to be decoded of the current subband into a fourth number of 8-dimensional vectors and one 4-dimensional vector, the fourth number being the quotient of a difference value of the number of the coefficients to be decoded contained in the current subband subtracting 4 divided by 8.

10. The method according to claim 7, wherein performing lossless decoding on the vectors partitioned from the coefficients to be decoded according to the selected dimension to obtain lattice index vectors comprises one or more of:

performing lossless decoding on the 8-dimensional vectors to obtain 8-dimensional lattice index vectors; or, performing lossless decoding on the 4-dimensional vectors to obtain 4-dimensional lattice index vectors.

11. The method according to claim 7, wherein the lattice vectors are absolute value lattice vectors;

after the mapping the lattice index vectors to lattice vectors, the method further comprises:

decoding symbols saving sign information before quantization for the non-zero coefficients of the absolute value lattice vectors, to obtain the signs before quantization of the non-zero coefficients, and correspondence between the signs before quantization of the non-zero coefficients and the non-zero coefficients; and assigning the signs before quantization of the non-zero coefficients to corresponding non-zero coefficients according to the correspondence.

12. An encoder, comprising:
a first flatness determination module for determining a flatness of a current coefficient to be encoded of a current subband according to coefficients that have been encoded;
a first vector partition module for selecting at least one dimension vector from at least two dimension vectors to partition the current coefficient to be encoded of the current subband and coefficients right adjacent to the current coefficient to be encoded into vectors, according to the number of the coefficients to be encoded contained in the current subband and the flatness of the current coefficient to be encoded determined by the first flatness determination module;
a quantization module for quantizing the vectors partitioned by the first vector partition module into lattice vectors according to the selected dimension, and mapping the lattice vectors to lattice index vectors; and
an encoding module for performing lossless encoding on the lattice index vectors.

13. The encoder according to claim 12, wherein the first vector partition module is used to, when the number of the coefficients to be encoded contained in the current subband is 4, partition the current coefficient to be encoded of the current subband and 3 sequential coefficients right adjacent to the current coefficient to be encoded into a 4-dimensional vector; or,
the first vector partition module is used to, when the number of the coefficients to be encoded contained in the current subband is larger than 4, and the flatness of the current coefficient to be encoded is less than a first preset threshold, partition the current coefficient to be encoded of the current subband and 7 sequential coefficients right adjacent to the current coefficient to be encoded into a 8-dimensional vector; or
the first vector partition module is used to, when the number of the coefficients to be encoded contained in the current subband is larger than 4, and the flatness of the current coefficient to be encoded is not less than the first preset threshold, partition the current coefficient to be encoded of the current subband and 3 sequential coefficients right adjacent to the current coefficient to be encoded into a 4-dimensional vector.

14. The encoder according to claim 12, wherein the first vector partition module is used to, when the number of the coefficients to be encoded contained in the current subband is a multiple of 8, partition the coefficients to be encoded of the current subband into a first number of 8-dimensional vectors, the first number being the quotient of the number of the coefficients to be encoded contained in the current subband divided by 8; or
the first vector partition module is used to when the number of the coefficients to be encoded contained in the current subband is not a multiple of 8, partition the coefficients to be encoded of the current subband into a second number of 8-dimensional vectors and one 4-dimensional vector, the second number being the quotient of a difference value of the number of the coefficients to be encoded of the current subband subtracting 4 divided by 8.

15. The encoder according to claim 12, wherein the quantization module is used to quantize one or more of:
the 8-dimensional vectors into E8 lattice vectors; or
the 4-dimensional vectors into D4 lattice vectors.

16. The encoder according to claim 12, further comprising:
a sign separation module for determining the absolute values of the vectors partitioned by the first vector partition module; wherein,
the quantization module is used to quantize the absolute values of the vector determined by the sign separation module into absolute value lattice vectors, and then map the absolute value lattice vectors to lattice index vectors.

17. The encoder according to claim 16, further comprising:
a saving module for saving sign information before quantization of the non-zero coefficients of the absolute value lattice vectors, the sign information comprising the signs before quantization of the non-zero coefficients, and correspondence between the signs before quantization of the non-zero coefficients and the non-zero coefficients, wherein,
the encoding module is used to losslessly encode the lattice index vectors, and encode the sign information saved by the saving module.

18. A decoder, comprising:
a second flatness determination module for determining a flatness of a current coefficient to be decoded of a current subband according to coefficients that have been decoded;
a second vector partition module for selecting at least one dimension vector from at least two dimension vectors to partition the current coefficient to be decoded of the current subband and coefficients right adjacent to the current coefficient to be encoded into vectors, according to the number of the coefficients to be decoded contained in the current subband and the flatness of the current coefficient to be decoded determined by the second flatness determination module;
a decoding module for performing lossless decoding on the vectors partitioned by the second vector partition module according to the selected dimension to obtain lattice index vectors; and
a reverse quantization module for mapping the lattice index vectors to lattice vectors.

19. The decoder according to claim 18, wherein the second vector partition module is used to, when the number of the coefficients to be decoded contained in the current subband is 4, partition the current coefficient to be decoded of the current subband and 3 sequential coefficients right adjacent to the current coefficient to be decoded into a 4-dimensional vector; or,
the second vector partition module is used to, when the number of the coefficients to be decoded contained in the current subband is larger than 4, and the flatness of the current coefficient to be decoded is less than a second preset threshold, partition the current coefficient to be decoded of the current subband and 7 sequential coefficients right adjacent to the current coefficient to be decoded into a 8-dimensional vector; or
the second vector partition module is used to, when the number of the coefficients to be decoded contained in the current subband is larger than 4, and the flatness of the current coefficient to be decoded is not less than the second preset threshold, partition the current coefficient to be decoded of the current subband and 3 sequential coefficients right adjacent to the current coefficient to be decoded into a 4-dimensional vector.

20. The decoder according to claim 18, wherein the second vector partition module is used to, when the number of the coefficients to be decoded contained in the current subband is a multiple of 8, partition the coefficients to be decoded of the current subband into a third number of 8-dimensional vectors, the third number being the quotient of the number of the coefficients to be decoded contained in the current subband divided by 8; or the second vector partition module is used to, when the number of the coefficients to be decoded contained in the current subband is not a multiple of 8, partition the coefficients to be decoded of the current subband into a fourth number of 8-dimensional vectors and one 4-dimensional vector, the fourth number being the quotient of a difference value of the number of the coefficients to be decoded contained in the current subband subtracting 4 divided by 8.

21. The decoder according to claim 18, wherein the decoding module is used to perform one or more of:

lossless decoding on the 8-dimensional vectors to obtain 8-dimensional lattice index vectors; or, lossless decoding on the 4-dimensional vectors to obtain 4-dimensional lattice index vectors.

22. The decoder according to claim 18, further comprising:

a sign decoding module for, when the lattice vectors obtained by the reverse quantization module are absolute value lattice vectors, decoding symbols saving sign information before quantization of the non-zero coefficients of the absolute value lattice vectors, so as to obtain the signs before quantization of the non-zero coefficients, and the correspondence between the signs before quantization of the non-zero coefficients and the non-zero coefficients; and assigning the signs before quantization of the non-zero coefficients to corresponding non-zero coefficients according to the correspondence.

* * * * *